(12) United States Patent
Laermer

(10) Patent No.: US 8,164,174 B2
(45) Date of Patent: Apr. 24, 2012

(54) MICROSTRUCTURE COMPONENT

(75) Inventor: Franz Laermer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 2518 days.

(21) Appl. No.: 10/416,140

(22) PCT Filed: Oct. 10, 2001

(86) PCT No.: PCT/DE01/03882
§ 371 (c)(1),
(2), (4) Date: Oct. 8, 2003

(87) PCT Pub. No.: WO02/38492
PCT Pub. Date: May 16, 2002

(65) Prior Publication Data
US 2004/0112937 A1    Jun. 17, 2004

(30) Foreign Application Priority Data
Nov. 7, 2000   (DE) ................... 100 55 081

(51) Int. Cl.
*H01L 23/48*  (2006.01)
(52) U.S. Cl. ......... 257/693; 257/E23.061; 257/E23.142; 438/116; 438/125
(58) Field of Classification Search .......... None
See application file for complete search history.

(56) References Cited

U.S. PATENT DOCUMENTS

| | | |
|---|---|---|
| 4,467,394 A | 8/1984 | Grantham et al. |
| 5,492,596 A | 2/1996 | Cho |
| 5,756,901 A | 5/1998 | Kurle et al. |
| 5,783,309 A * | 7/1998 | Faure et al. ............. 428/432 |
| 6,062,461 A | 5/2000 | Sparks et al. |
| 6,319,729 B1 | 11/2001 | Kvisteroey et al. |

FOREIGN PATENT DOCUMENTS

| | | |
|---|---|---|
| DE | 195 37 814 | 4/1987 |
| DE | 4224383 | 1/1993 |
| DE | 19800574 | 7/1999 |
| DE | 199 40 512 | 3/2001 |
| EP | 0 136 249 | 4/1985 |
| EP | 0 962 275 | 12/1999 |
| EP | 0 994 330 | 4/2000 |

OTHER PUBLICATIONS

Anodic Bonding for Integrated Capacitive Sensors, IEEE/MEMS, Travemunde (Germany), Feb. 1992, pp. 43-48.*
Henmi et al, "Vacuum Packaging for Microsensors by Glass-Silicon Anodic Bonding", in Sensors and Actuators, May 1, 1994, pp. 243-248.
Ueda et al., "Development of Micromachined Silicon Accelerometer," Jun. 1, 1994, pp. 72-77.
Esashi et al., "Anodic Bonding for Integrated Capacitive Sensors," Micro Electro Mechanical Systems, 1992, MEMS '92, Proceedings—An Investigation of Micro Structures, Sensors, Actuators, Machines and Robot, IEEE Travemunde, Germany, Feb. 2 to 7, 1992, New York, New York,, IEEE, Feb. 4, 1992, pp. 43 to 48, Figures 1, 4, paragraph "Feedthrough".

* cited by examiner

*Primary Examiner* — Jarrett Stark
(74) *Attorney, Agent, or Firm* — Kenyon & Kenyon LLP

(57) ABSTRACT

A microstructure component, in particular an encapsulated micromechanical sensor element, including at least one microstructure patterned out from a silicon layer being encapsulated by a glass element. At least the region of the glass element covering the microstructure is furnished with an electrically conductive coating on its side facing the microstructure.

27 Claims, 4 Drawing Sheets

MICROSTRUCTURE COMPONENT

FIELD OF THE INVENTION

The present invention relates to a microstructure element, and in particular relates to an encapsulated micromechanical sensor element.

BACKGROUND INFORMATION

U.S. Pat. No. 5,756,901 describes an acceleration sensor produced by surface micromechanics, which is provided with an encapsulation for protection from external influences such as humidity or dirt particles, as well as for the maintenance of a vacuum, and a layer system for producing such a sensor. In addition, German Published Patent Application No. 195 37 814 (DE 195 37 814 A1) describes a sensor and a method for its production, in which a movable sensor element is patterned out of a silicon layer with the aid of surface-micromechanical methods.

DE 195 37 814 A1 also describes a method for encapsulating sensor elements by the bonding of silicon caps by a seal-glass solder connection, which, however, on account of the flow behavior of the solder, requires a large surface reserve. Alternative, space-saving methods not having surface reserves are based on a so-called anodic bond process, in which Pyrex glass or a similar glass is connected to a silicon layer by applying an electric voltage of 1000 V or more, at a temperature of 400° C., for example, so that, by a charge separation in the glass ($Na^+$ ions and $O^{2-}$ ions) a high-strength connection between the Pyrex and the silicon is created after an adhesion phase that is at first reversible.

It is customary, in the case of such an anodic bond of a cap or plate made of Pyrex glass over surface micromechanical sensor structures, to first prestructure it in such a way that it has a recess in the vicinity of the sensor structures, and subsequently to connect it hermetically sealed to the silicon from which the sensor structures were patterned out. However, in this context the problem arises that, because of the high electric voltage applied, the self-supporting and movable sensor structures are deflected electrostatically, and partially bond to the glass plate. This danger is increased further in that Pyrex glass demonstrates good adhesion properties to silicon, and stores electric charges on its surface which exert forces on the sensor structures even without external influence, and thus impair their function. Feed-through openings in the cap may be provided for a front side contact of the sensor structures that is frequently desired.

If, on the other hand, the recess is deepened to such an extent that the electrostatic attraction is reduced to a reasonable degree, such a cap is no longer able to act at the same time as the upper stop for the protection of the micromechanical structures generated, i.e. in the overload case, such as in case of mechanical shocks to acceleration sensor structures, the latter are deflected upwards, without hindrance, so far that they are destroyed. Moreover, structuring Pyrex glass is problematical when etching depths of some 10 μm are required.

In the encapsulation by anodic bonding of Pyrex glass to silicon, it is also disadvantageous that, in the process, oxygen is liberated from open glass surfaces, so that, in practice, the lowest pressures that may be enclosed under such caps is about 100 mbar, which is insufficient by far for rotational rate sensors made by surface micromechanics, which generally require working pressures of about 1 mbar. To overcome this problem, using materials which bind the oxygen in the cavity formed by the cap has been suggested. However, this procedure is expensive, and a great effort from a process technology point of view.

Additionally, in the case of encapsulation of microstructure components, one may use a silicon wafer as the encapsulation wafer including a glass layer on the surface, for example, a Pyrex glass layer. This is then ground to the desired thickness, polished, and then provided with structuring in the form of a cavity as the cap for the sensor element. Thereby, the outflow of oxygen into the interior of the cavity is reduced, and on the other hand, the electrically conductive silicon wafer which forms the actual cap may be electrically contacted even though this may be costly from a process engineering point of view, and this guards against the danger of electrostatic discharge. However, even in this specific embodiment, the danger of electrostatic collapse and the bonding of the capped, microstructured sensor elements to the Pyrex glass layer or an exposed silicon area on the bottom of the cavity in the Pyrex glass layer is still present. In addition, in this case too, many times the cap cannot act as a stop for limiting a vertical deflection of the encapsulated microstructures in the case of overload, since, as a result of the relatively high tolerances in the grinding and polishing, the thickness of the Pyrex glass layer, which determines the distance of the cavity bottom from the microstructure, is too great to effectively limit the deflection, or, on the other hand, is too small to be able to exclude an electrostatic collapse during the anodic bonding. Moreover, the grinding down of the Pyrex layer with great precision represents a considerable cost factor, usually requiring residual tolerances of +/−5 μm. This being the case, the residual thickness of this layer is designed to be at least 20 μm, which makes it ineffective as a stop. In addition, the structuring of Pyrex glass layers that are etched to be 20 μm thick by plasmas or hydrofluoric acid solutions is costly and time-intensive.

SUMMARY

The microstructure component according to an example embodiment of the present invention provides a secure, hermetically sealed and reliable encapsulation of sensor elements in use that is produced by surface micromechanics without danger of an electrostatic collapse caused by excessive deflection in the direction of the glass element. Thus, an electric voltage may be freely selected for application to the connection of the glass element to, for example, a silicon layer, without having to consider the microstructures, since, according to the present invention, these are shielded on all sides from undesired electrical fields.

Additionally, electrostatic discharge of the inside of the cap during the operation of the microstructure component is avoided, and it is possible to bring the inside of the cap to a specified potential or to contact the electrically conductive coating in the inside of the cap from outside, without a substantial effort.

According to an example embodiment, an outflow of oxygen from the glass element on its side facing the microstructures is prevented by the coating, and a highly precise grinding process or deep structuring of the glass element may be omitted. In addition to this, the glass element may now, at the same time, take on the function of a vertical stop for limiting the vertical deflection of the microstructures in the case of an overload without additional costs, i.e. an encapsulation is achieved which combines the advantages of the anodic bonding technology with a stop function, and which excludes a relevant outflow of oxygen from the glass element. The electrically conductive coating applied thus also acts very advantageously as a seal, and as a diffusion barrier for oxygen ions, so that even low pressures such as approximately 1 mbar, as are used for rotational rate sensors, are able to be maintained for long periods of time in the encapsulated microstructure component, without additional measures, such as the application of acceptor materials.

The side of the glass element facing away from the microstructure, i.e. the outside of the encapsulation, may include an electrically conductive layer, since then, the electrical voltage applied during bonding is distributed homogeneously over the entire surface of the glass element. This layer permits the electrostatic holding of the silicon wafer in a plasma etching system, during later backside structuring processes of the silicon layer, from which each respective microstructure may be patterned out. Moreover, it is of advantage that this layer also may be applied only in a later process state, for instance, directly before carrying out a backside etching.

According to an example embodiment, the glass element is connected to the silicon layer, which takes place at increased temperatures such as 400° C., and at least partially, an alloy is formed between the coating of metal applied to the inside of the cap or the glass element and the silicon, which leads to a particularly good ohmic contact having a low contact resistance between the metal coating and the silicon in the boundary regions. In this way, the enclosed microstructures are further shielded from electrical fields and charges.

According to one embodiment in which a metal layer is used as the electrically conductive coating, it may exerts low adhesion forces on silicon, and thus a low tendency to adhere. Because this metal layer is electrically tied to the silicon substrate and is accessible from the outside via a separate contact surface, voltage differences between the microstructures and the underside of the cap, i.e. the metal layer, may be effectively suppressed or set specifically for special applications. Such a voltage suppression may advantageously be carried out by dynamically incorporating the metal coating of the glass element on its inside with the potential of the microstructures.

If a cavity has been generated in the glass element above the region taken up by the microstructures, and then the electrically conductive coating, such as in the form of a metal coating is applied to the glass element and the inside of the cavity, the glass element may be polished off, for example, as a Pyrex glass plate, freeing it planarly from surmounting metal, instead of performing a photo process and subsequent etching for structuring the metal coating. Thereby, a planar transition from glass to metal may be created in the border or edge region of the cavity.

The metal layer may be thickened, for instance to 0.5 µm to 5 µm, since this leads to a greater and improved overlap of metal and silicon in the border region, i.e. the planar transition generated by the polishing. Then, in this overlap, there is created, in a subsequent anodic bonding, at least at a point, a metal-silicon alloy, which ensures a particularly good electrical contact of the metal layer to the silicon layer. This procedure has the additional advantage that no topographical differences appear on the glass layer which might impair the bonding. In addition, the thicker metal layer leads to a further improved electrical shielding and diffusion-blocking effect.

According to an example embodiment in which the glass element is designed as a thin glass layer, which is connected on its side facing away from the microstructure to a supporting body, such as a silicon layer or a silicon wafer, an improved adaptation of glass element and the silicon layer with respect to arising mechanical stresses may be achieved, since the mechanical influence of the glass layer decreases on account of its clearly reduced thickness compared to a free glass plate.

Furthermore, according to this embodiment, the division of the microstructure components on a wafer after manufacturing is simplified, since now the sawing through of the complete layer buildup may be performed in a single sawing step. In contrast, when a thicker glass plate is used without a supporting body, two sawing steps are required, one for the glass plate and one for the substrate, i.e. the silicon wafer.

The supporting body in the form of a silicon wafer assures a homogeneous application of the electrical voltage applied during bonding with respect to a glass plate, i.e. the additional conductive layer on the outside of the cap is unnecessary. Accordingly, the accuracy of the residual layer thickness after a grinding and polishing process does not need to be as precise, which makes it relatively cost-effective.

Thus, there is a trade off between the simpler and more cost-effective sawing process and the somewhat more costly processing of the glass layer and the supporting body connected to it.

The microstructural component according to an example embodiment of the present invention may provide that, for its production, only relatively simple, easily manageable structuring processes are required, and that, at the same time, a considerable reduction is achieved in the usage of chip surface during the encapsulation. Furthermore, for structuring the glass element with a cavity, it is only necessary to etch the glass element to a depth of some micrometers, for which resist masks may also be used.

DETAILED DESCRIPTION

Figure 1:
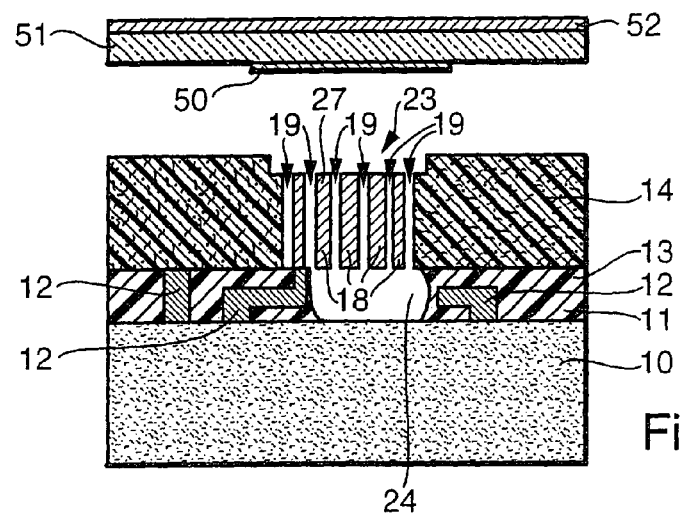
FIGS. 1, 2, and 3 illustrate sequential stages of a first example embodiment of a method of encapsulating of a microstructure component according to the present invention.
Figure 2:
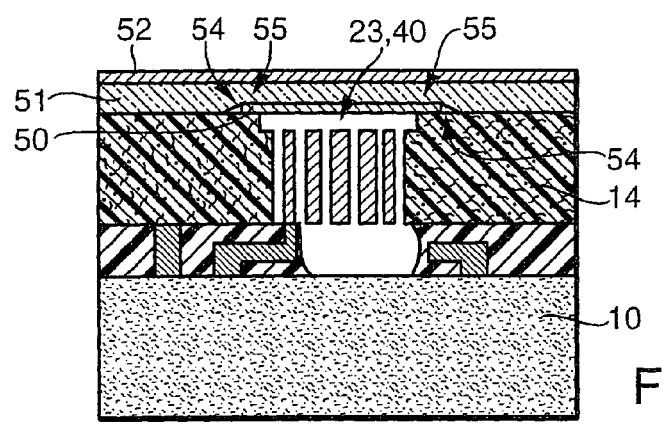
Figure 3:
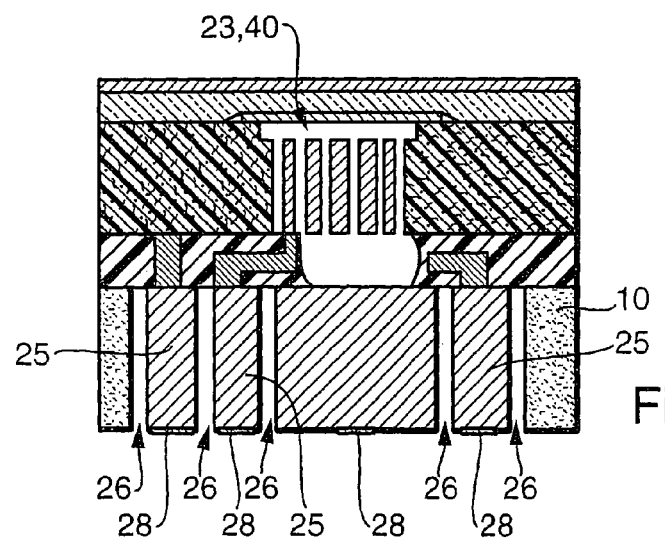

FIGS. 1, 2 and 3 illustrate a first example embodiment of a method of encapsulating of a microstructure component according to the present invention. FIG. 1 shows a silicon wafer as substrate 10 in section, onto which, in a known method, a lower insulating layer 11 made of an oxide or insulating oxide has been applied. On lower insulating layer 11 there is also present a conducting structure 12, which is made, for example, of buried polysilicon. On buried conducting structure 12 or lower insulating layer 11, then, there is deposited, analogously to lower insulating layer 11, an upper insulating layer 13 made of an oxide or an insulating oxide, on which, in turn, a silicon layer 14 made of polysilicon is deposited, which has a thickness of 10 µm to 100 µm. Substrate 10, conducting structure 12 and silicon layer 14 are of the same doping type, i.e. either p-doped or n-doped.

From silicon layer 14, largely self-supporting microstructures 18 have been patterned out according to suitable masking and etching techniques, and are separated from one another by trenches 19. Silicon layer 14 is the "bonding frame" for microstructures 18. There is further provided at least one microcontacting structure 27 as a part of the microstructure component, which is connected to the conducting structure 12 in an electrically conductive manner, and via which individual microstructures 18 are able to be controlled electrically. Below microstructures 18 a first recess is 24 provided, so that microstructures 18 are suspended in silicon layer 14, largely in a self-supporting manner. The microstructures 18 and microcontacting structure 27 may be set back or "countersunk" (flush-mounted) in a conventional manner with respect to silicon layer 14, so that above these there is created a second recess 23, which is, for instance, 5 μm to 10 μm deep. The individual method steps for generating the microstructure component according to FIG. 1 employ conventional techniques from the manufacturing of acceleration sensors, apart from the encapsulation which is subsequently explained. For example, the production of "countersunk" structures in surface micromechanics is discussed in German Published Patent Application No. 199 40 512.

FIG. 1 also shows a glass layer 51 which is designed in the form of a Pyrex glass plate of a thickness such as 0.5 mm. On this glass layer 51, on the side facing microstructures 18, there is then applied a thin coating 50 in the form of a metal layer and it is structured in such a way that it covers the region of second recess 23, i.e., particularly the region taken up by microstructures 18 and microcontacting structure 27, and at the same time radially exceeds the area bounded by second recess 23 according to a top view. Finally, it is provided that glass layer 51, on its side facing away from microstructures 18, is furnished over its whole surface with a conducting layer 52, for example, with a metal layer. This conducting layer 52, as noted above, may be provided in the further production of the micro structure component.

FIG. 2 illustrates a method step following that shown in FIG. 1. The glass layer 51 along with coating 50 and conducting layer 52 is been brought into contact with the surface of silicon layer 14. Thereafter, substrate 10 is grounded and an electrical voltage was applied between glass layer 51 and substrate 10 of typically 1000 V at a temperature such as 400° C. This method, which is denoted as "anodic bonding", leads to an intimate, hermetically sealed connection of glass layer 51 to silicon layer 14.

In this connection, by hermetically sealed is understood a connection which is both gastight and sealed against moisture.

FIG. 2 also shows that, because of the connection of glass layer 51 to silicon layer 14, coating 50, in an edge region 55, is present between glass layer 51 and silicon layer 14. This edge region 55, which depends on the form of second recess 23, for example, may be annular, and may be closed in on itself.

Since coating 50 in the example explained has a thickness of 3 nm to 100 nm, e.g., 10 nm to 50 nm, there remains a pocket region 54 between glass layer 51 and silicon layer 14 that is not bonded, i.e. in this region silicon layer 14 is not in contact with glass layer 51, the region's extension clearly depending on the thickness of coating 50. It typically extends over a region 5 to 10 times the thickness of coating 50.

Since upon the connection of glass layer 51 to silicon layer 14 there also comes about an intimate, electrically conductive contact between silicon layer 14 and coating 50, coating 50, during the entire process of anodic bonding, regardless of the high applied electrical voltage and even after completion of the bonding, is fixed to the potential of silicon layer 14 and via that, to that of substrate 10, to which microstructures 18 are also connected via microcontacting structure 27 and conducting structure 12. This being the case, microcontacting structures 18 are effectively shielded by coating 50 from electric fields and charges. It is noted that because of the slight thickness of coating 50, the extension of pocket region 54 is negligible, and does not significantly impair the encapsulation achieved.

Thus, at the end of the method step according to FIG. 2, a cavity 40 has been created above microstructures 18, which has a depth corresponding to the height of recess 23.

FIG. 3 illustrates the following method steps for the completion of the microstructure component, in which, for the electrical contacting of microcontacting structure 27 or above that of microstructures 18, insulating trenches 26 are etched in from the backside in the usual manner, which reach in their depth to lower insulating layer 11. Terminal contacting structures 25 are defined by these insulating trenches 26, which are furnished with a usual metallization in the form of contact surfaces 28 and are also connected to conductive structures 12. In the example explained, contact surfaces 28 are metal surfaces, made of aluminum, for example, or aluminum-silicon, aluminum-silicon-copper, chromium/gold or tungsten-titanium/gold. Incidentally, as indicated in FIG. 3, coating 50 is electrically accessible via silicon layer 14 and a conductive structure 12, and also possibly via a terminal contacting structure 25 and a contact surface 28. However, in this context, it should be emphasized that, if glass layer 51 is suitably perforated analogously to DE 195 37 814 A1, an electrical contacting may also be made from the front side of silicon layer 14. For this purpose, one has only to prestructure glass layer 51 in such a way that it has passage openings, so-called contact holes, in the region connecting surfaces of microcontacting structure 27 and microstructures 18 that are also applied at the front, through which later the contact surfaces that are between silicon layer 14 and glass layer 51 may be contacted using wire bonding.

It is also noted that the distance of microcontacting structures 18 from coating 50 is given by the height of cavity 40, according to FIG. 3, i.e. coating 50 and glass layer 51 connected to it act at the same time as a vertical stop for microstructures 18 in the case of overload. In addition to this, it should be emphasized that, for the implementation of rotational rate sensors, the manufacturing process of the encapsulated microstructure component is carried out in such a manner that cavity 40 encloses a vacuum such as 1 mbar.

As materials for producing coating 50 in the form of a metal layer, chromium, aluminum, gold, platinum, titanium, silver or combinations or alloys of these are suitable.

In an example embodiment, coating 50 includes two partial layers, one metal layer and one an adhesion layer improving the adhesion to the glass layer, the adhesion layer may be being a chromium layer, a tungsten-titanium layer or a chromium-copper layer, and have a thickness of only a few nanometers. Such a thickness is sufficient, since coating 50 carries no currents as a rule, and only has to counter electrostatic discharges. It may be ensured in this manner that the anodic bonding used behaves without problems. Thus, because of the elasticity of glass layer 51 and the attractive surface forces that appear between glass layer 51 and silicon layer 14, good adhesion is achieved in spite of the topography of the surface of glass layer 51 caused by coating 50.

Figure 4:
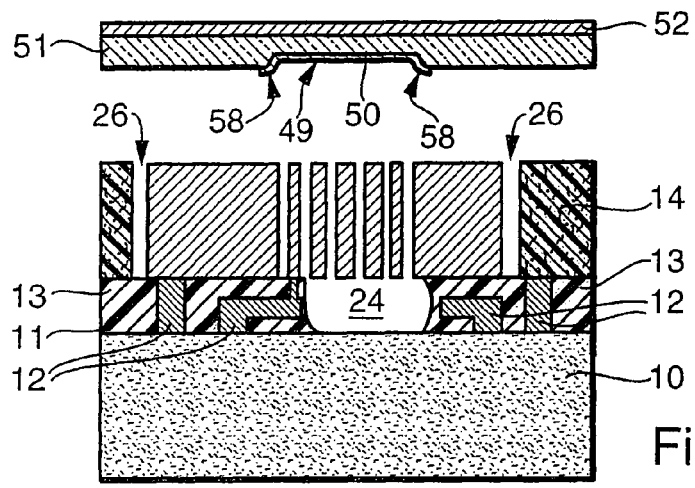
FIGS. 4, 5, and 6 illustrate sequential stages of a second example embodiment of a method of encapsulating of a microstructure component according to the present invention.
Figure 5:
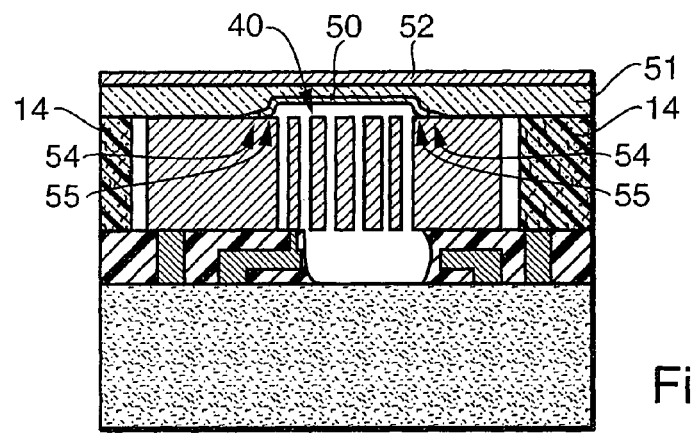
Figure 6:
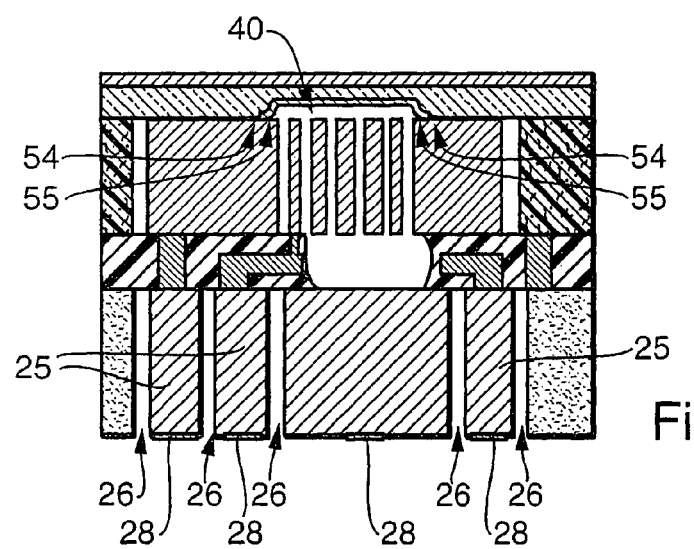

FIGS. 4 through 6 illustrate a second example embodiment of a method of encapsulating of a microstructure component according to the present invention. Microstructures 18 and microcontacting structure 27 are not set back with respect to silicon layer 14 or countersunk. Furthermore, in FIG. 5 it is shown that, depending on the application, silicon layer 14 is also able to have insulating trenches 26, produced in the usual manner, analogously to trenches 19. These insulating trenches 26 are used, for example for the electrical separation of different regions of silicon layer 14.

FIG. 4 shows that glass layer 51 made of Pyrex glass in this exemplary embodiment has a cavity 49 which is dimensioned in such a manner that it covers the region in silicon layer 14 taken up by microstructures 18 and microcontacting structure 27, respectively. Consequently, cavity 49 forms a cap over microstructures 18 after glass layer 51 is connected to silicon layer 14, whereby, once again, a cavity 40 is created, i.e. cavity 49 replaces the countersinking of microstructures 18 as in FIG. 1.

Cavity 49 in glass layer 51 has a depth of a few micrometers, such as 1 μm to 10 μm, and once again a coating 50 is applied to glass layer 51 in the region of cavity 49 and beyond it in edge region 55, which is analogous to the coating according to the first example embodiment. In particular, this coating 50 may have a thickness of 10 nm to 50 nm.

Because of coating 50, since consideration of electrostatic attractive forces and discharges no longer has to be taken with respect to the anodic bonding of silicon layer 14 and glass layer 51, a depth of cavity 49 of a few micrometers is sufficient, i.e. it is able to have been etched wet-chemically using a hydrofluoric acid solution or dry-chemically by etching using reactive fluorine plasmas into glass layer 51.

FIG. 4 also shows that cavity 49 has sidewall profiles which become narrower going inwards, i.e. in the direction towards the bottom of the cavity. This simplifies a subsequent application of coating 50 to the sidewalls and the bottom of cavity 49 as well as to edge region 55 which extends into glass layer 51. Moreover, cavity 49, may have the shape of a tub, with a rounded edge 58 running all around, which is also furnished with coating 50.

For the production of cavity 49, having rounded edge 58 known plasma etching processes may be used. However, wet etching techniques may also be suitable, since, in view of the low etching depths of a few micrometers photo-resist masking is also sufficient.

Furthermore, since hydrofluoric acid creeps below photo-resist masking at the edges, as is known, a profile of cavity 49 is automatically created which is undercut isotropically in the direction towards the cavity bottom, and which, in the vicinity of the rounded edge 58 runs flat toward the outside. Consequently, because of the isotropic etching character of a hydrofluoric acid solution and the creeping under mentioned, it is enough to obtain a concave sidewall surface in the upper part of cavity 49 which runs out flat.

Plasma etching and wet etching may be combined, since, using plasma etching, a sidewall profile may be implemented that becomes narrower going towards the cavity bottom, and on the other hand, by a subsequent overetching, for instance, using hydrofluoric acid solution, the explained creeping under the photo-resist mask removes the edges of cavity 49, so that a rounded edge 58 is created which runs out flat.

In this manner it may be ensured that cavity 49 is formed for a subsequent metallization or a subsequent application of coating 50 in such a manner that an even metallization comes about at all locations of the surface of cavity 49, without threatening to tear off at sharp edges, which may prevent a reliable electrical contact between coating 50 and silicon layer 14.

Coating 50 as in FIG. 4, as shown in FIG. 1, may be applied by being sputtered on.

FIG. 5 explains a following method step in which glass layer 51 having cavity 49 and coating 50 is brought into contact with the surface of silicon layer 14. In this context, it is essential that cavity 49 is placed precisely above microstructures 18, so that coating 50 is in contact again in a self-enclosed circumferential edge region 55 with silicon layer 14. On account of the height of coating 50 of 10 nm to 50 nm, pocket regions 54 are created, which, however do not cause interference.

With respect to the adjustment of glass layer 51 furnished with cavity 49, it is advantageous if conductive layer 52, applied to the side of glass layer 51 facing away from microstructures 18, is first of all not yet present, because then the adjustment may be performed optically in a simple manner through transparent glass layer 51. If conductive layer 52 is already present, to accomplish the adjustment, adjustment markings may be used, for example, which specify the relative position of glass layer 51 and silicon layer 14 to each other.

According to FIG. 5, since coating 50 goes beyond cavity 49 in edge region 55, during the anodic bonding of glass layer 51 and silicon layer 14, which is carried out analogously to the first exemplary embodiment, coating 50 is pressed against silicon layer 14 in the adhesion phase during the bonding, and thus electrically contacted with it.

FIG. 6 explains, analogously to FIG. 3, how the backside of substrate 10 is furnished with terminal contacting structures 25, contact surfaces 28 and insulating trenches 26. In this context, it is again provided that coating 50 be connected in an electrically conductive manner to a terminal contacting structure 25 via silicon layer 14 and a conductive structure 12, so that, for example, the electric potential of coating 50 may be brought along dynamically with an electric potential of microstructures 18. In this manner one obtains an hermetically sealed, encapsulated microstructure component, which is electrically shielded from outer fields. At the same time, the height of cavity 49 limits the maximum deflection of microstructures 18, for instance during overload.

Figure 7:
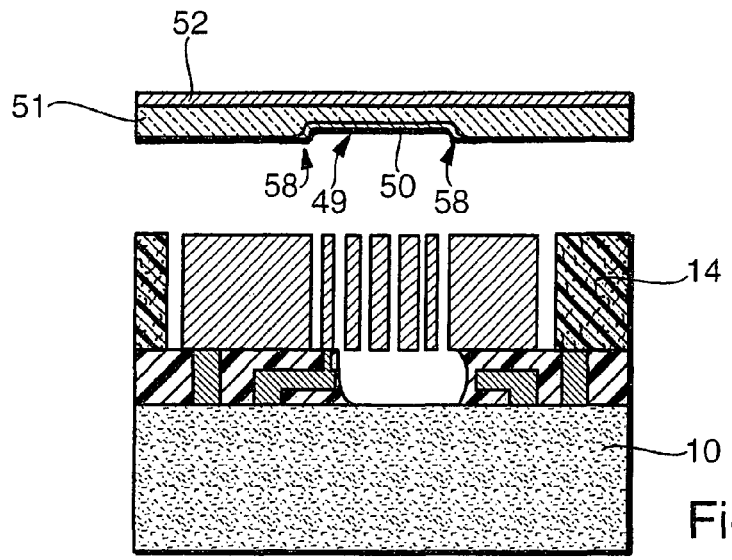
FIGS. 7, 8 and 9 illustrate sequential stages of a third example embodiment of a method of encapsulating of a microstructure component according to the present invention.
Figure 8:
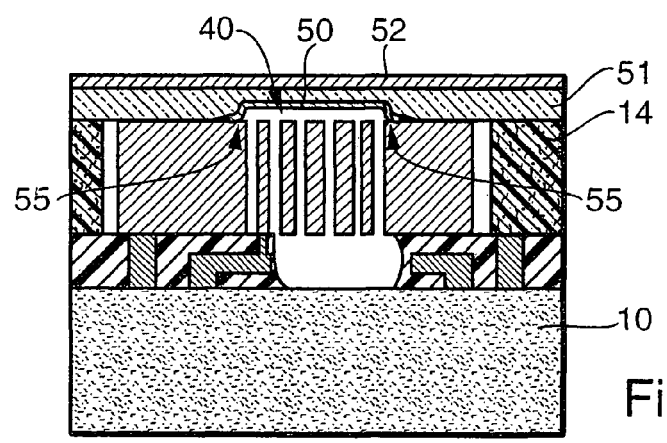
Figure 9:
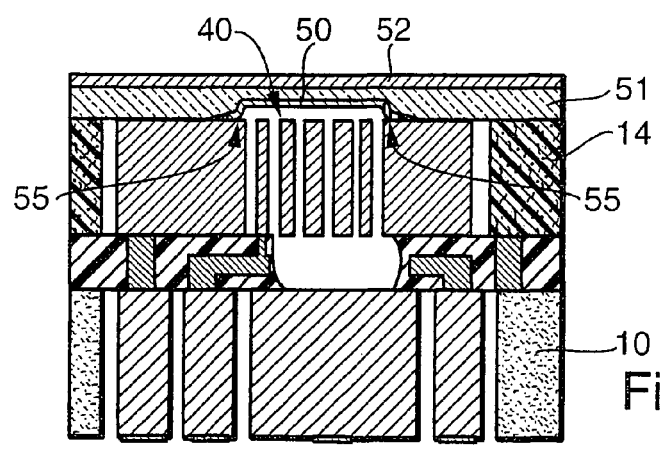

FIGS. 7, 8 and 9 illustrate a third example embodiment which differs from the second exemplary embodiment according to FIGS. 4, 5 and 6 only in that, starting from FIG. 4 or alternatively from a first of all whole surface metallization of the side of glass layer 51 facing microstructures 18 having cavity 49, glass layer 51 having coating 50 is polished off in a planar manner, and consequently, apart from the region of cavity 49, again becomes free from coating 50. In this manner, a planar, rounded transition from glass layer 51 to coating 50 is automatically created in the vicinity of rounded edge 58.

In FIG. 7 it is further provided, in contrast to FIG. 4, that coating 50 is clearly selected to be thicker, for example, 0.5 μm to 5 μm, which leads to the overlap of coating 50 and silicon layer 14 being greater in edge regions 55 when glass layer 51 is connected to silicon layer 14 according to FIG. 8. Consequently, in anodic bonding according to FIG. 8 there is created in edge regions 55, at least a point, an alloy of the material of coating 50, i.e. a metal, with the silicon from silicon layer 14, which leads to a particularly good electrical contact between coating 50 and silicon layer 14.

An aspect of the example embodiment of the method according to the present invention illustrated in FIGS. 7, 8 and 9 compared to the example embodiment illustrated in FIGS. 4, 5 and 6 may be that no topographical differences, impairing the connection of silicon layer 14 and glass layer 51, appear which lead to the formation of pocket regions 54. Furthermore, in the third example embodiment, coating 50 may be selected comparatively to be thick, since this leads to an improved electrical shielding and an improved diffusion blocking effect against the outflow of oxygen from glass layer 51 into cavity 40. The production of the microstructure component as in FIG. 9 corresponds to FIG. 6 which has been described above.

Figure 10:
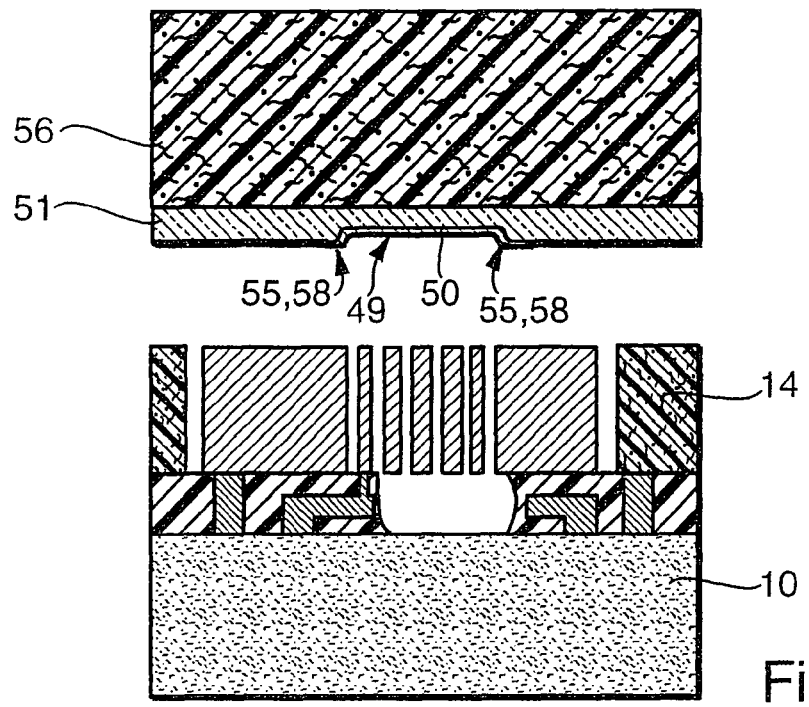
FIG. 10 illustrates a primary stage of another example embodiment of a method of encapsulating of a microstructure component according to the present invention.

In a further example embodiment, explained with the aid of FIG. 10, instead of starting with a glass layer 51 in the form of a relatively thick Pyrex glass plate, it starts with a silicon wafer, or rather a silicon layer 56, on the surface of which glass layer 51 is applied in the form of a thin Pyrex glass layer, which has a thickness of 1 μm to 50 μm. To do this, a platelet or a wafer made of Pyrex glass is first connected to silicon wafer 56 according to techniques known in the art, and is subsequently ground down so that glass layer 51 is obtained at a layer thickness of 20 μm to 50 μm. Alternatively, application of the Pyrex glass to silicon wafer 56 may be performed especially at the later bonding stage, but also by sputtering on, for instance, a 1 μm thick Pyrex layer and later polishing.

Since the thickness of glass layer 51 that is achieved is not a critical parameter, and since it runs over the surface of silicon wafer 56, grinding back is a relatively cost-effective process which does not have great accuracy requirements. It is only important that the residual layer thickness of glass layer 51 is clearly greater than the depth of cavity 49 generated subsequently. It is also important, when generating cavity 49, that glass layer 51 is not etched through right down to silicon wafer 56, i.e. in the vicinity of cavity 49, a thickness of glass layer 51 remains which guarantees a sufficient electrical insulation between silicon wafer 56 and the final generated coating 50. The example embodiment according to FIG. 10, is otherwise completely analogous to the example embodiment according to FIGS. 7, 8 and 9.

Figure 11:
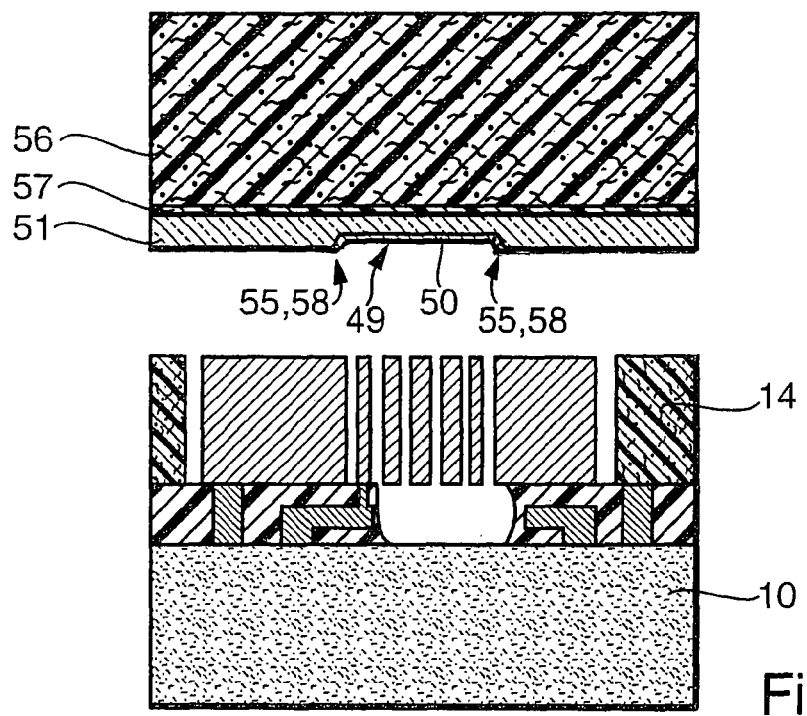
FIG. 11 illustrates a primary stage of another example embodiment of a method of encapsulating of a microstructure component according to the present invention.

A further example embodiment, which is explained with reference to FIG. 11, starts from the example embodiment as in FIG. 10, an insulating layer 57 being additionally provided between glass layer 51 and silicon wafer 56, for example, made of a thermally produced silicon oxide. This insulating layer 57 may have a thickness of 1 μm to 2 μm, and may be used for the electrical insulation of silicon wafer 56 from glass layer 51. In order to produce insulating layer 57 on silicon wafer 56, the latter is first thermally oxidized, and subsequently the Pyrex glass plate is connected to the thermally oxidized surface of silicon wafer 56, before the grinding back. However, as an alternative, glass layer 51 may first be sputtered on and subsequently polished in this case too.

On account of additional insulating layer 57, this embodiment provides that even if the residual layer thickness of ground-back glass layer 51 may at some time become critically thin, the insulating oxide still may ensure a sufficient electrical resistance to breakdown with respect to an electric voltage applied during subsequent anodic bonding of glass layer 51 to silicon layer 14. Other than that, the example embodiment according to FIG. 11 corresponds to the exemplary embodiment already described with the aid of FIGS. 7, 8 and 9.

What is claimed is:

1. A microstructure component, comprising:
   at least one microstructure patterned out of a layer;
   a glass element encapsulating the microstructure and connected to the layer by an anodic bond; and
   an electrically conductive coating situated on at least a region of the glass element on a side facing the microstructure, the coating coupled directly to the layer and extending beyond a region of the glass element covering the microstructure, the coating electrically accessible from a side of the layer facing away from the glass element.

2. The microstructure component of claim 1, wherein the layer includes a silicon layer.

3. The microstructure component of claim 1, wherein the coating includes at least one metal layer.

4. The microstructure component of claim 3, wherein the metal layer includes at least one of a chromium layer, an aluminum layer, a gold layer, a platinum layer, a nickel layer, a silver layer and a combination thereof.

5. The microstructure component of claim 3, wherein the coating includes an adhesion layer coupled to the glass element.

6. The microstructure component of claim 5, wherein the adhesion layer includes one of a chromium layer, a tungsten-titanium layer, and a chromium-copper layer.

7. The microstructure component of claim 1, wherein the coating has a thickness between 3 nm and 100 nm.

8. The microstructure component of claim 1, wherein the coating includes an enclosed edge region connected to the layer.

9. The microstructure component of claim 8, wherein the edge region includes, in at least one position, an alloy of the coating material and the layer material.

10. The microstructure component of claim 9, wherein the alloy includes a metal-silicon alloy.

11. The microstructure component of claim 1, wherein the coating is electrically contactable from outside the encapsulated microstructure.

12. The microstructure component of claim 1, wherein the glass element includes one of a thick glass plate 100 micrometer to 2 mm in thickness and a glass layer 1 to 100 micrometers in thickness connected to a supporting body.

13. The microstructure component of claim 1, wherein the glass element includes a glass including an alkaline element.

14. The microstructure component of claim 1, wherein the glass element includes pyrex.

15. The microstructure component of claim 1, wherein the glass element includes, in at least one position, a conductive layer on a side facing away from the microstructure.

16. The microstructure component of claim 15, wherein the conductive layer includes a metal layer.

17. The microstructure component of claim 12, wherein the supporting body includes a silicon layer.

18. The microstructure component of claim 12, wherein the supporting body includes a silicon wafer.

19. The microstructure component of claim 17, wherein the supporting body includes a layer system including a silicon layer and an insulating layer separating the glass layer from the silicon layer.

20. The microstructure component of claim 1, wherein a cavity is enclosed between the microstructure and the coating.

21. The microstructure component of claim 1, wherein the microstructure is hermetically sealed by the glass element at a pressure of between 0.1 mbar and 10 mbar.

22. The microstructure component of claim 1, wherein the glass element includes a structuring in a region covering the microstructure having a surface including the coating.

23. The microstructure component of claim 22, wherein the structuring includes a cavity.

24. The microstructure component of claim 23, wherein the cavity has a depth of 1 micrometer to 20 micrometers.

25. The microstructure component of claim 23, wherein the cavity is configured as a tub including an encircling, rounded edge including the coating.

26. The microstructure component of claim 23, wherein the cavity includes one of slant-wise standing and curved sidewalls including the coating, the cavity tapering in a direction toward a bottom of the cavity.

27. The microstructure component of claim 23, wherein all sides of the cavity includes one of slant-wise standing and curved sidewalls including the coating, the cavity tapering in a direction toward a bottom of the cavity.

* * * * *